United States Patent
Demir

(10) Patent No.: US 8,385,482 B2
(45) Date of Patent: Feb. 26, 2013

(54) START-UP AUTOMATIC FREQUENCY CONTROL (AFC) METHOD AND APPARATUS

(75) Inventor: Alpaslan Demir, East Meadow, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

(21) Appl. No.: 13/438,595

(22) Filed: Apr. 3, 2012

(65) Prior Publication Data

US 2012/0201335 A1 Aug. 9, 2012

Related U.S. Application Data

(63) Continuation of application No. 12/185,361, filed on Aug. 4, 2008, now Pat. No. 8,149,963, which is a continuation of application No. 11/754,013, filed on May 25, 2007, now Pat. No. 7,412,013, which is a continuation of application No. 11/088,116, filed on (Continued)

(51) Int. Cl.
*H04L 27/06* (2006.01)

(52) U.S. Cl. ........ 375/344; 375/149; 375/150; 342/199; 370/342; 370/347; 370/503

(58) Field of Classification Search .......... 370/503, 370/342, 347; 375/344, 149, 150; 324/199
See application file for complete search history.

(56) References Cited

U.S. PATENT DOCUMENTS

| 5,574,754 | A | 11/1996 | Kurihara et al. |
| 5,994,932 | A | 11/1999 | Ando |
| 6,055,265 | A | 4/2000 | Kim |
| 6,160,841 | A | 12/2000 | Stansell, Jr. et al. |
| 6,222,874 | B1 | 4/2001 | Walley et al. |
| 6,236,343 | B1 | 5/2001 | Patapoutian et al. |
| 6,313,789 | B1 | 11/2001 | Zhodzishsky et al. |
| 6,327,257 | B1 | 12/2001 | Khalifa |
| 6,370,188 | B1 | 4/2002 | Wu et al. |
| 6,385,264 | B1 | 5/2002 | Terasawa et al. |
| 6,480,558 | B1 | 11/2002 | Ottosson et al. |
| 6,532,255 | B1 | 3/2003 | Gunzelmann et al. |
| 6,549,564 | B1 | 4/2003 | Popovic |
| 6,597,729 | B1 | 7/2003 | Schmidl et al. |
| 6,775,318 | B2 | 8/2004 | Chen et al. |
| 6,804,315 | B2 | 10/2004 | Demir et al. |
| 6,826,244 | B2 | 11/2004 | Demir et al. |
| 2001/0021199 | A1 | 9/2001 | Lee et al. |
| 2002/0064146 | A1 | 5/2002 | Okuyama |
| 2004/0043746 | A1 | 3/2004 | Hiramatsu |

FOREIGN PATENT DOCUMENTS

| EP | 1 071 224 | 1/2001 |
| GB | 2 377 126 | 12/2002 |
| JP | 2001-333119 | 11/2001 |

OTHER PUBLICATIONS

Hwang, Sang-Yun, et al., "Performance Analysis of Initial Cell Search Using Time Tracker for W-CDMA", Globecom'01, 2001 IEEE Global Telecommunications Conference, San Antonio, Nov. 25-29, 2001, pp. 3055-3059.

*Primary Examiner* — Ted Wang
(74) *Attorney, Agent, or Firm* — Volpe and Koenig, P.C.

(57) ABSTRACT

A method and apparatus for use in connection with wireless communication to adjust the frequency of an oscillator to synchronize with a received signal by correlating a synchronization code channel with training sequences to estimate relative offsets which are employed to estimate an error, which is then filtered. The filtered output preferably provides a voltage controlling a voltage controlled oscillator (VCO). The same technique may be employed to control a numeric controlled oscillator (NCO).

20 Claims, 3 Drawing Sheets

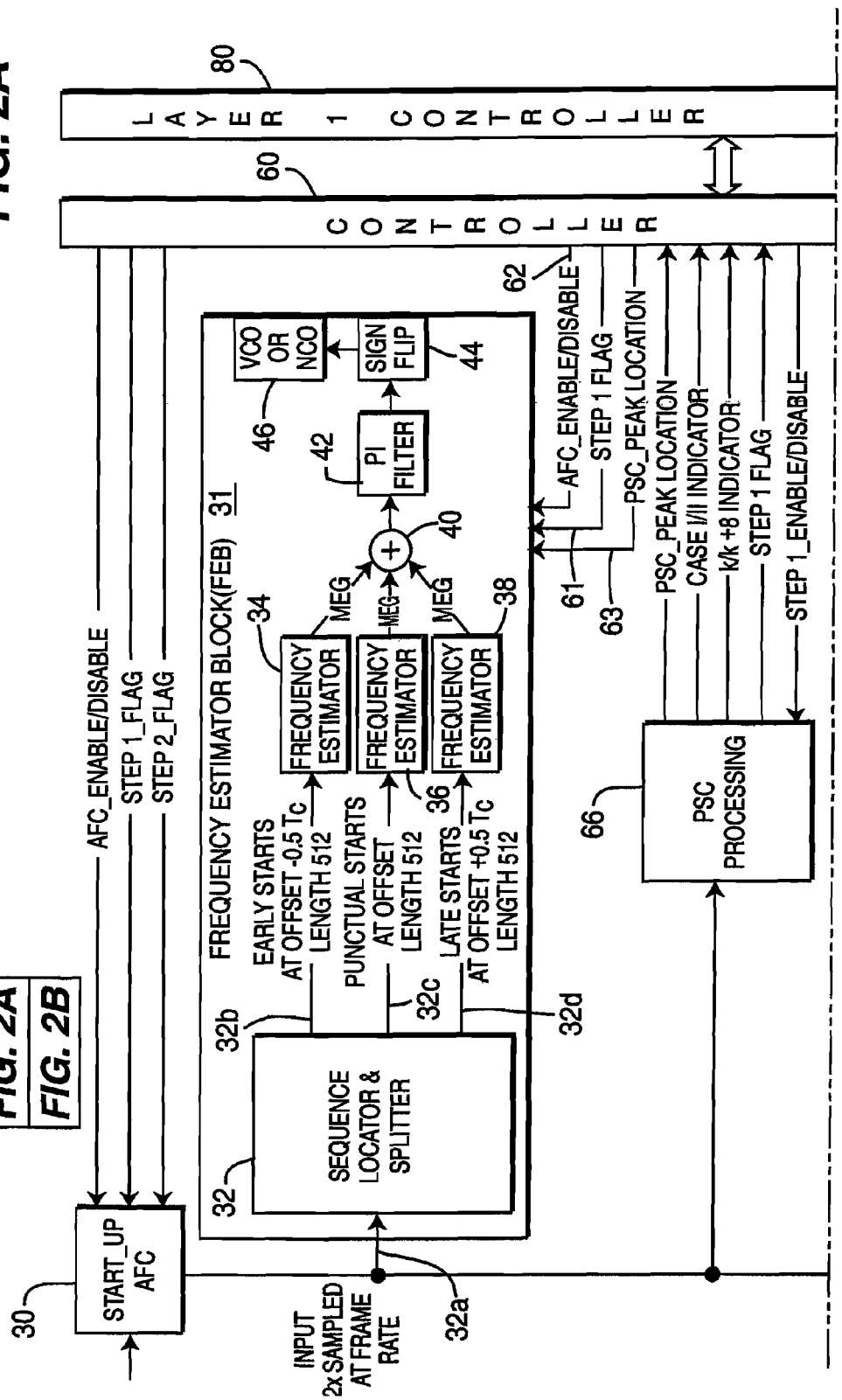

START-UP AUTOMATIC FREQUENCY CONTROL (AFC) METHOD AND APPARATUS

CROSS REFERENCE TO RELATED APPLICATIONS

This application is a continuation of U.S. patent application Ser. No. 12/185,361, filed Aug. 4, 2008, now U.S. Pat. No. 8,149,963, which is a continuation of U.S. patent application Ser. No. 11/754,013, filed May 25, 2007, now U.S. Pat. No. 7,412,013, which is a continuation of U.S. patent application Ser. No. 11/088,116, filed Mar. 23, 2005, now U.S. Pat. No. 7,236,547, which is a continuation of U.S. patent application Ser. No. 10/629,429, filed Jul. 29, 2003, now U.S. Pat. No. 7,187,732, which claims the benefit of U.S. Provisional Application No. 60/399,818 filed on Jul. 31, 2002, which are all incorporated by reference as if fully set forth.

FIELD OF THE INVENTION

The invention relates to wireless communication and wireless devices. More particularly, the invention relates to initialization of a communication link between a base station (BS) and a user equipment (UE).

BACKGROUND OF THE INVENTION

During an initial cell search (ICS) or power-up of a UE, a training sequence of known symbols is used by the receiver to estimate the transmitted signal. In a time division duplex (TDD) signal, for example, the midamble of a TDD frame conventionally contains the training sequence of symbols. The conventional cell search process consists of a Step 1 algorithm which processes a primary synchronization code (PSC) on the primary synchronization code channel (PSCH) for synchronization channel (SCH) location determination. A Step 2 algorithm processes the secondary synchronization codes (SSC) for code group determination and timeslot synchronization, and a Step 3 algorithm performs midamble processing.

Variable control oscillators (VCOs) are commonly used at the end of an automatic frequency control (AFC) process to adjustably control the frequency of the receiver to achieve synchronization between a transmitter and a receiver. The input for the VCO is a control voltage signal, which is typically generated by a control circuit that processes the amplitude and phase of the received symbols. A common problem during an AFC process is the initial fluctuations resulting from a potentially significant frequency offset between the transmitter and the receiver.

SUMMARY

A method and apparatus for use in connection with wireless communication to adjust the frequency of an oscillator to synchronize with a received signal by correlating a synchronization code channel with training sequences to estimate positive and negative offsets which are employed to estimate an error, which is then filtered. The filtered output preferably provides a voltage controlling a voltage controlled oscillator (VCO). The same technique may be employed to control a numeric controlled oscillator (NCO).

BRIEF DESCRIPTION OF THE DRAWINGS

The invention will be understood from the following description and drawings in which like elements are designated by like numerals and, wherein:

FIGS. 2A and 2B, taken together, comprise a block diagram of the interaction between start-up AFC and algorithm Steps 1, 2 and 3 of cell search.

FIG. 2 shows the manner in which FIGS. 2a and 2b are arranged to create a complete block diagram.

DETAILED DESCRIPTION OF THE PREFERRED EMBODIMENT(S)

Figure 1:
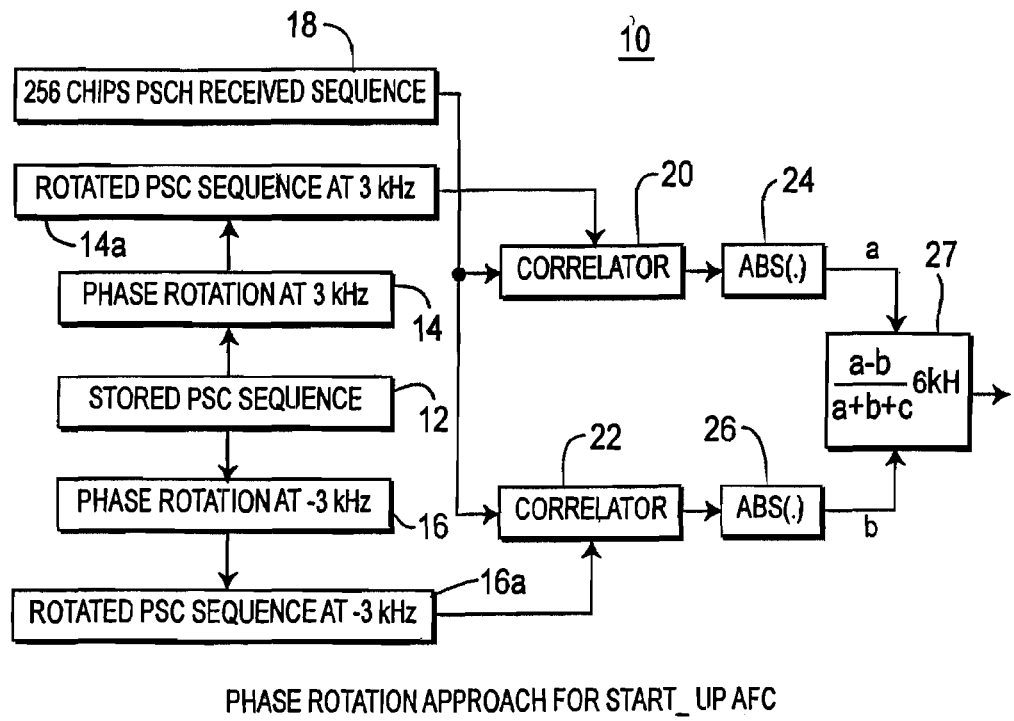
FIG. 1 is a block diagram showing the phase rotation approach for start-up AFC.

FIG. 1 is a block diagram of a start-up adaptive frequency control (AFC) 10 used to reduce the frequency offset between a base station (BS) and user equipment (UE) during initial cell search procedure. Start-up AFC uses a phase rotation approach, which is based on the correlations of two sequences with the primary synchronization code (PSC). The stored PSC sequence 12 is rotated in opposing directions at 14, 14a, 16, 16a to respectively determine correlations with the received sequence 18 at 20 and 22. The absolute values (a and b) are obtained at 24 and 26 and to obtain the value $$\left(\frac{a-b}{a+b+c}\right) 6 \text{ kHz},$$

from circuit 27, where c is an arbitrary constant provided to prevent division by zero. The phase rotation at −3 kHz alternatively can be replaced by a conjugate of a rotated PSC sequence at 3 kHz since the PSC sequence can only have values of (1+j) and (−1−j).

During start-up AFC process, it is assumed that the PSC location provided is correct. Once Step 1 completes generation of the first outputs, the start-up AFC starts running. The Step 1 process and start-up AFC process run in parallel. Optimally, start-up AFC reduces the frequency offset from 6 kHz to less than 2 kHz in the least number of iterations. Table 1 shows a particular advantage of frequency correction which is an increase in allowable integrations. The number of integrations is limited, however, due to chip slip. The chip-slip upper boundary is 0.5 Tc since the maximum correlation is generated one sample later for a method utilizing twice the chip rate sampling. Table 1 summarizes the allowable number of integrations as frequency offset is reduced. Table 2 provides information on performance degradation for a coherent combining technique in the presence of carrier frequency offset.

TABLE 1

Frequency Offset vs. Number of Integrations Allowed

| Frequency Offset | Slip per frame | Number of integrations allowed |
|---|---|---|
| ±6 kHz = ±3 ppm | 0.1152 Tc | 4 |
| ±4 kHz = ±2 ppm | 0.0768 Tc | 6 |
| ±2 kHz = ±1 ppm | 0.0384 Tc | 13 |
| ±1 kHz = ±0.5 ppm | 0.0192 Tc | 26 |

TABLE 2

Frequency Offset vs. Code Length for Coherent Combining

| Loss in dB | Length of the code integrated coherently | Carrier frequency Offset Fc = 2 GHz | |
|---|---|---|---|
| 2.42  | 256 | ±3 ppm   | 6 kHz |
| 1.04  | 256 | ±2 ppm   | 4 kHz |
| 0.26  | 256 | ±1 ppm   | 2 kHz |
| 0.06  | 256 | ±0.5 ppm | 1 kHz |
| 12.62 | 512 | ±3 ppm   | 6 kHz |
| 4.53  | 512 | ±2 ppm   | 4 kHz |
| 1.04  | 512 | ±1 ppm   | 2 kHz |
| 0.26  | 512 | ±0.5 ppm | 1 kHz |

The start-up AFC procedure includes a mechanism to realign the primary synchronization code (PSC) position that may shift during correction. The Step 1 procedure can be run to eliminate the need for the mechanism while the start-up AFC algorithm is running. The Step 1 procedure updates the peak location every $4^{th}$ frame.

Figure 2B:
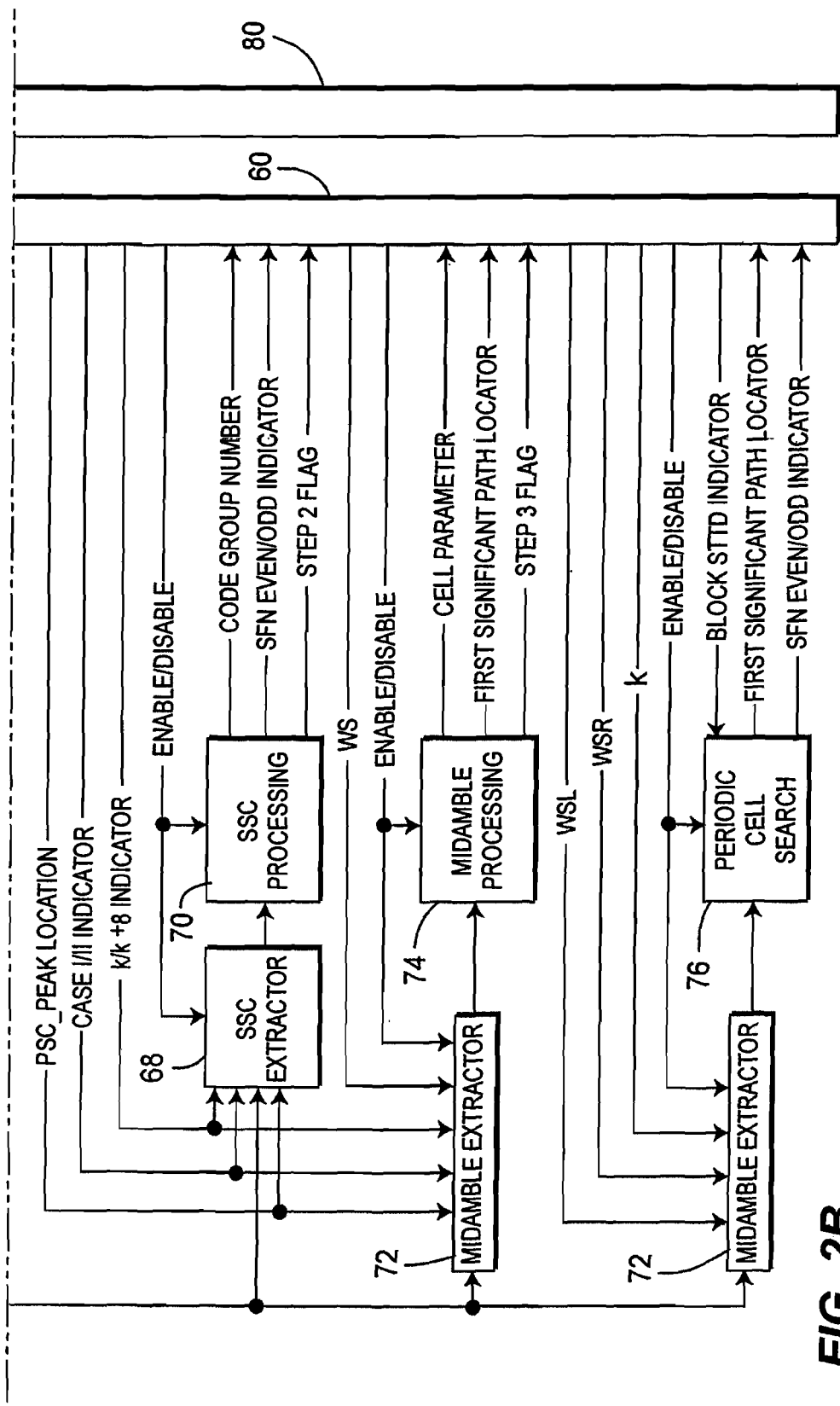

FIG. 2 depicts the parallel processing relationship among start-up AFC and Steps 1, 2 and 3 of cell searching. Of particular concern is the relationship between Step 1 and start-up AFC. Since Step 1 works in parallel with the startup AFC, there is no need for a code tracker circuit to follow a given path. Each time Step 1 updates an output that is based on the largest detected value, start-up AFC uses the new peak location to estimate the new frequency offset.

The frequency estimator block (FEB) 31 of the start-up AFC comprises a Sequence Locator and Splitter 32, frequency estimators 34-38, a proportional plus integral (PI) filter 42, and a voltage controlled oscillator (VCO) or numeric controlled oscillator (NCO) 46 coupled to PI filter 42 through the sign flop 44. The input 32a to the Sequence Locator and Splitter 32 includes the PSC peak location chip-offset provided by Step 1. Start up AFC 30 is an open loop gain control block that steps through pre-defined gain levels in order to set proper input power level before digitizing the input. The main input to both Step 1 and the Sequence Locator and Splitter 32 is sampled at twice the chip rate with a length of 76,800 complex elements. Since the chip-offset points to the peak location, the beginning of the PSC is 511 samples before the chip-offset. The outputs of the Sequence Locator and Splitter 32 are generated by the following general equation:

$$\text{Output} = \text{input}[i-511]i \qquad \text{Eq. (1)}$$

Accordingly, the three particular outputs of the Sequence Locator and Splitter 32 are represented by the following equations for early (32b), punctual (32c) and late (32d) estimates:

$$\text{Early}[i] = \text{input}[i-511]i = \text{offset}-1, \text{offset}, \text{offset}+1, \ldots, \text{offset}+510 \qquad \text{Eq. (2)}$$

$$\text{Punctual}[i] = \text{input}[i-511]i = \text{offset}, \text{offset}+1, \text{offset}+2, \ldots, \text{offset}+511 \qquad \text{Eq. (3)}$$

$$\text{Late}[i] = \text{input}[i-511]i = \text{offset}+1, \text{offset}+2, \text{offset}+3, \ldots, \text{offset}+512 \qquad \text{Eq. (4)}$$

Although the Locator and Splitter 32 in the example given in FIG. 2, is a PSC locator, it should be understood the same approach can be used with any received sequences other than PSC.

The input samples to the Sequence Locator and Splitter are taken at twice the chip rate.

The frequency estimators 34, 36 and 38 each receive one of the three inputs provided by Equations (2)-(4). The frequency estimators estimate a different frequency offset, summed at 40, for each input sequence in accordance with FIG. 1. The frequency offset, summed at 40, is the summation of early, punctual and late estimates.

Figure 3:
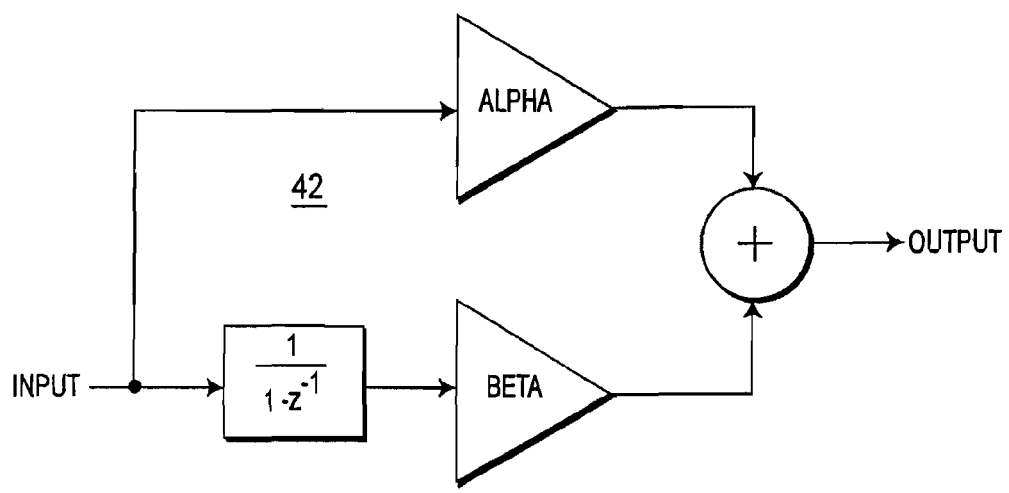
FIG. 3 shows a process diagram for a PI filter.

The sum of the estimates is passed through a proportional plus integral (PI) filter 42 with coefficients alpha and beta, respectively as shown in detail in FIG. 3. The PI filter bandwidth has two settings. Initially, alpha and beta are preferably $\frac{1}{2}$ and $\frac{1}{256}$, respectively as shown in detail in FIG. 3. The loop gain k is set at (k=−1.0). During steady state, alpha and beta are set to $\frac{1}{16}$ and $\frac{1}{1024}$, respectively. FIG. 3 depicts such a PI filter structure 42. The preferable settings for coefficients alpha and beta are summarized in Table 3. However, other filters may be substituted for the PI filter.

TABLE 3

PI Filter Coefficients as a Function of Operating Conditions.

| Condition | alpha | beta |
|---|---|---|
| initial | 1/2 | 1/256 |
| steady state | 1/16 | 1/1024 |

Steady state condition is established when:

the startup AFC completes at least ten (10) iterations;

while the last eight (8) outputs (inputs to VCO) are put into a buffer of length eight (8); the difference between the absolute value of the average of the first half and that of the second half is within ±1 kHz; and the current output to the VCO is within ±1 kHz of the absolute value of the average of the second half.

For digital applications, a numerically controlled oscillator (NCO) is used in place of the VCO.

The start-up AFC algorithm relies on PSC location update to estimate the carrier frequency offset. Step 1 runs during frequency correction to update the PSC location. As such, it is preferable that start-up AFC is begun immediately following a successful Step 1 process, with Step 1 running in parallel. Step 1 continues to provide updated PSC locations once every N1 frames as per the Step 1 algorithm, where N1 is the maximum number of frames for averaging. Start-up AFC is run in this manner for a duration of L frames, with L=24 as the preferred value. The Step 1 FLAG 61 from controller 60 is set when a sequence is detected. The FEB 31 runs when the controller 60 provides an enable condition to FEB 31 at 62. Since the peak locations shift left or right in time, the Step 1 algorithm is run constantly. At the end of L frames, the start-up AFC reduces the frequency offset to about 2 kHz in many cases, which provides considerable enhancement to the Step 2 performance. The inclusion of L frames contributes to the overall cell search delay budget and hence is chosen conservatively to be L=24.

PSC processing block 66 correlates against the primary synchronization code in (synchronization channel) (SCH) over frames. The SCH location is not known.

SSC extractor block 68 utilizes the SCH location and extracts only the SCH portion, which is then passed to SSC processing block 70.

SSC processing block 70 correlates against the secondary synchronization code in synchronization channel over SCH.

Midamble Extractor block 72 utilizes the SCH location and SSC processing results and extracts the midamble portion to pass to midamble processing block 74.

Midamble processing block 74 correlates against possible midambles given by SSC processing and picks the one with the highest energy.

Periodic Cell Search block 76 performs a process which constantly searches for the best base station for the given period.

Controller 60 coordinates among stages to synchronize to a base station.

Layer 1 Controller 80 coordinates all layer 1 related hardware and software in order to maintain proper operation in the receiver.

What is claimed is:

1. A start-up automatic frequency control method comprising:
   initial cell search processing a received sequence to facilitate the determination of a frequency location of a received signal by:
      producing a first frequency estimate based on an early version of the received sequence, a second frequency estimate based on a punctual version of the received sequence, and a third frequency estimate based on a late version of the received sequence;
      combining the first, second and third frequency estimates; and
      filtering the combined frequency estimates;
   wherein the first, second and third frequency estimates are each produced by:
      rotating a phase of a stored sequence to produce a first version of a stored sequence having a rotated phase;
      correlating the received sequence with the first version of the stored sequence to produce a first phase correlation;
      correlating the received sequence with a second version of the stored sequence that has a different rotated phase than the first version to produce a second phase correlation; and
      combining the first and second phase correlations to provide the frequency estimate.

2. The method of claim 1 wherein the initial cell search processing is repeated every N frames where N is an integer greater than 0.

3. The method of claim 1 wherein the stored sequence is a primary synchronization code sequence.

4. The method of claim 1 further comprising repeating the rotating, correlating and combining a given number of times to produce a series of frequency estimates for each of the first, second and third frequency estimates.

5. The method of claim 1 wherein a received input power level of the received signal is adjusted prior to the rotating, correlating and combining.

6. The method of claim 5 wherein the received signal is digitized after adjustment of the power level and the power level is set employing open loop gain control.

7. The method of claim 1 wherein the initial cell search processing includes obtaining a primary synchronization code.

8. The method of claim 7 further comprising employing the primary synchronization code to extract a secondary synchronization code from the received signal.

9. The method of claim 1 further comprising using the filtered combined frequency estimates to control the generation of a frequency by a numerically controlled oscillator.

10. The method of claim 1 further comprising using the filtered combined frequency estimates to control the generation of a frequency by a voltage controlled oscillator.

11. A wireless communication device comprising:
    an initial cell search processing component configured to process a received sequence to facilitate the determination of a frequency location of a received signal by:
       producing a first frequency estimate based on an early version of the received sequence, a second frequency estimate based on a punctual version of the received sequence, and a third frequency estimate based on a late version of the received sequence;
       combining the first, second and third frequency estimates; and
       filtering the combined frequency estimates with a filtering component;
    the initial cell search processing component including a frequency estimator configured to produce the first, second and third frequency estimates by:
       rotating a phase of a stored sequence to produce a first version of a stored sequence having a rotated phase;
       correlating the received sequence with the first version of the stored sequence to produce a first phase correlation;
       correlating the received sequence with a second version of the stored sequence that has a different rotated phase than the first version to produce a second phase correlation; and
       combining the first and second phase correlations to provide the frequency estimate.

12. The wireless communication device of claim 11 further comprising a sequence locator associated with the initial cell search processing component and configured to selectively produce received signal input for the frequency estimator.

13. The wireless communication device of claim 11 wherein the frequency estimator is configured to use is a primary synchronization code as the received sequence.

14. The wireless communication device of claim 11 wherein the filtering component is configured to selectively integrate frequency estimates responsive to an initial or steady state conditions of a cell search process.

15. The wireless communication device of claim 11 wherein the filtering component is a Proportional integral (PI) filter.

16. The wireless communication device of claim 15 wherein the filtering component is a digital filter having a delay element of $1/(1-z^{-1})$.

17. The wireless communication device of claim 11 further comprising an oscillator configured to produce an adjusted frequency during initial cell search using the filtered combined frequency estimates.

18. The wireless communication device of claim 17 wherein the oscillator is a voltage controlled oscillator (VCO).

19. The wireless communication device of claim 17 wherein the oscillator is a numeric controlled oscillator (NCO).

20. A user equipment comprising the wireless communication device of claim 11.

* * * * *